United States Patent [19]
Loerzer et al.

[11] Patent Number: 5,474,875
[45] Date of Patent: Dec. 12, 1995

[54] PHOTOSENSITIVE MIXTURE FOR PRODUCING RELIEF AND PRINTING PLATES

[75] Inventors: Thomas Loerzer, Neustadt; Thomas Telser, Weinheim; Thomas Zwez, Karlsruhe, all of Germany

[73] Assignee: BASF Lacke+Farben, Muenster, Germany

[21] Appl. No.: 348,250

[22] Filed: Nov. 28, 1994

Related U.S. Application Data

[63] Continuation of Ser. No. 10,319, Jan. 28, 1993, abandoned.

[30] Foreign Application Priority Data

Jan. 29, 1992 [DE] Germany ............................ 42 02 332.7

[51] Int. Cl.$^6$ ............................ G03C 1/725; G03C 1/73; G03C 1/735
[52] U.S. Cl. ........................ 430/281; 430/286; 430/292; 430/293; 430/306
[58] Field of Search ................................ 430/281, 286, 430/292, 293, 306

[56] References Cited

U.S. PATENT DOCUMENTS

| | | | |
|---|---|---|---|
| 2,948,611 | 8/1960 | Barney et al. | 96/35 |
| 3,024,180 | 3/1962 | McGraw et al. | 204/163 |
| 3,674,486 | 7/1972 | Milgrom et al. | 96/35.1 |
| 3,798,035 | 3/1974 | Varga et al. | 96/35.1 |
| 3,951,657 | 4/1976 | Recchia et al. | 96/35.1 |
| 4,054,231 | 8/1977 | Toda et al. | 96/115 |
| 4,197,130 | 4/1980 | Nakamura et al. | 430/286 |
| 4,275,142 | 6/1981 | Hosaka et al. | 430/271 |
| 4,940,650 | 7/1990 | Kurtz et al. | 430/286 |
| 5,096,801 | 3/1992 | Koya et al. | 430/293 |

FOREIGN PATENT DOCUMENTS

| | | |
|---|---|---|
| 422488 | 4/1991 | European Pat. Off. . |
| 2050539 | 5/1971 | France . |
| 2364873 | 12/1973 | Germany . |
| 200357 | 4/1983 | Germany . |
| 56-075644 | 6/1981 | Japan . |
| 1358062 | 6/1974 | United Kingdom . |
| 0395822 | 5/1975 | United Kingdom . |
| 1552653 | 9/1979 | United Kingdom . |

OTHER PUBLICATIONS

Cunningham et al., "Preparation and Stress–Strain Properties of ABA–Type Block Polymers of Styrene and Isoprene or Butadiene", *J. of App. Polym. Sci.*, vol. 12, pp. 23–24, 1968.

Pat. Abstr. of Japan, vol. 8, No. 275 (p. 321) (1712), Dec. 15, 1984.

Pat. Abstr. of Japan, vol. 10, No. 278 (p. 499) (2334), Sep. 20, 1986.

Pat. Abst. of Japan, vol. 12, No. 429 (p. 785) (3276) Nov. 14, 1988.

Abstract of JP–A 63 309 568 (english language).

*Primary Examiner*—Charles L. Bowers, Jr.
*Assistant Examiner*—Geraldine Letscher
*Attorney, Agent, or Firm*—Keil & Weinkauf

[57] ABSTRACT

A photosensitive mixture useful for producing relief and printing plates consists essentially of
(a) at least one block copolymer of styrene, butadiene and/or isoprene,
(b) at least one photopolymerizable olefinically at least monounsaturated organic compound,
(c) at least one photoinitiator, and
(d) at least one azo dye.

6 Claims, No Drawings

PHOTOSENSITIVE MIXTURE FOR PRODUCING RELIEF AND PRINTING PLATES

This application is a continuation of application Ser. No. 08/010,319, filed on Jan. 28, 1993, now abandoned.

The present invention relates to a photosensitive mixture consisting essentially of a block copolymer of styrene, butadiene and/or isoprene, at least one photopolymerizable olefinically at least monounsaturated organic compound, a photoinitiator and at least one specific dye. This mixture is suitable for producing relief and printing plates, in particular for flexographic printing.

Photosensitive layers of photopolymerizable mixtures for producing relief and printing plates, in particular for flexographic printing, have been repeatedly described. If for example such known mixtures are used to produce flexographic printing plates in the relief thicknesses of about 1.7–6.4 mm which are customary in the printing industry, for example according to DE-A-2138582, 2223808, 2364873, 2610206, 2631837, 2720228, 2815678, and U.S. Pat. Nos. 2,948,611, 3,024,180, 3,674,486, 3,798,035 and 3,951,657, these plates have only a small exposure latitude, ie. the time necessary for firmly adhering grids, lines or halftone dots is approximately the same as the time at which the shadow well depth in the negative dot on the i falls below a lower limit. As a consequence the irradiation time must be accurately maintained to obtain a suitable printing plate. Otherwise, grids, lines and/or halftone dots will not be firmly supported and shadow well depths will not be sufficient, so that for example halftone areas will be poorly reproduced in printing. It is an object of the present invention to add small amounts of an organic compound to layers of photopolymerizable mixtures in order that in the known production of relief plates the exposure latitude may be improved without to any significant extent adversely affecting the other properties of the photopolymerizable mixtures in relief plate making. These additives should preferably have no adverse effect on the necessary minimum irradiation time. It is very particularly desirable to find additives which at the same time, through alteration in the absorption characteristics, permit visual assessment of the imagewise exposed plate prior to development in order that faulty exposures are not put through the time and energy intensive development process.

We have found, surprisingly, that this object is achieved by a photosensitive mixture consisting essentially of
  (a) at least one block copolymer of styrene, butadiene and/or isoprene,
  (b) at least one photopolymerizable olefinically at least monounsaturated organic compound,
  (c) at least one photoinitiator, and
  (d) at least one dye,
wherein said dye (d) comprises at least one azo dye of one of the general formulae (I) to (V)

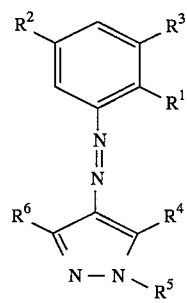

(I)

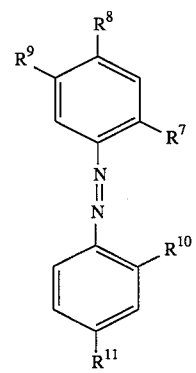

(II)

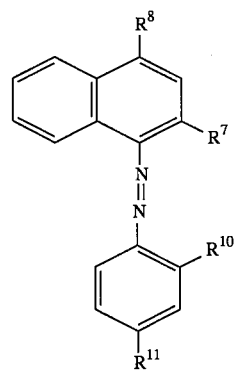

(III)

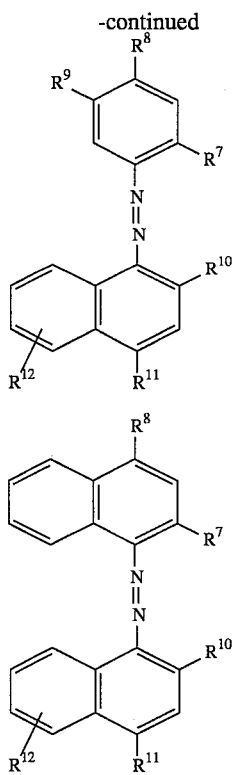

where
- $R^1$=H, OH, O⁻, COOH or COO⁻,
- $R^2$=H or $NO_2$,
- $R^3$=H or $SO_3H$,
- $R^4$=H, OH or O⁻,
- $R^5$=or phenyl,
- $R^6$=H or $CH_3$, with the proviso that if $R^1$=O⁻ or COO⁻ and $R^4$=O$^{31}$ two molecules of the azo dyes of the general formula (I) will be combined with one another via a $Cr^{+4}$ central atom to form a $Cr^{+\infty}$ complex,

- $R^7$=H, $CH_3$, COOH, COOR where R=$C_1$- to $C_{12}$-alkyl, $OCH_3$ or $NO_2$,
- $R^8$=H,

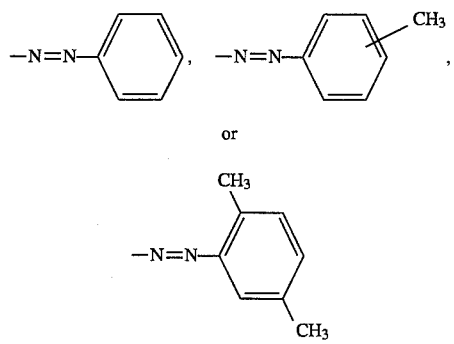

- $R^9$=H, $CH_3$, $NO_2$ or $SO_3H$,
- $R^{10}$=H, OH, $NH_2$, NHR or $NR_2$ where R=$C_1$- to $C_{12}$-alkyl,
- $R^{11}$=H, OH, $NH_2$, NHR or $NR_2$ where R=$C_1$- to $C_{12}$-alkyl,
- $R^{12}$=H, $C_1$- to $C_{12}$-alkyl or $SO_3H$.

The photosensitive mixture of the invention preferably contains

| from 60 to 90 | parts by weight of component (a), |
| from 1 to 20 | parts by weight of component (b), |
| from 0.01 to 10 and | parts by weight of component (c) |
| from 0.001 to 0.1 | part by weight of component (d). |

The present invention also provides a process for producing relief and printing plates by subjecting a supported photosensitive layer to imagewise exposure under actinic light and developing the relief plate by washing out the nonirradiated parts of the layer, wherein the photosensitive layer consists essentially of the photosensitive mixture of the present invention.

The process of the invention is suitable for producing relief letterpress plates, in particular flexographic plates.

The particular advantages of the photosensitive mixtures of the invention are that they provide improved image reproduction and improved development of shadow well depths in relief plate making.

The formative components of the photosensitive mixtures of the invention will now be more particularly described.

Component (a) comprises at least one block copolymer of styrene and butadiene and/or isoprene, for example styrene/isoprene/styrene copolymers. Suitable block copolymers of this type and the preparation thereof are described for example in R. E. Cunningham et al., J. Appl. Polymer Sci., 12 (1968), 1. The monomer ratios in the block copolymer are in general 10–30 percent by weight of styrene and 70–90 percent by weight of butadiene or isoprene or 70–90 percent by weight of a butadiene/isoprene mixture. The Shore A values of the block copolymers are between about 30 and 70.

Component (a) is in general present in the photosensitive mixture of the invention in amounts of from 60 to 90, preferably from 70 to 80, parts by weight. Preferred components (a) are block copolymers of 15–20 percent by weight of styrene and 80–85 percent by weight of isoprene, butadiene or butadiene/isoprene mixture.

Suitable components (b) are the customary photopolymerizable ethylenically monounsaturated or polyunsaturated organic compounds as are used for producing photopolymeric printing plates and are compatible with component (a). Examples of components (b) are the esters of acrylic acid and/or methacrylic acid with monohydric or polyhydric alcohols, such as butyl (meth)acrylate, 2-ethylhexyl (meth)acrylate, lauryl (meth)acrylate, ethylene glycol dimethacrylate, 1,4-butanediol di(meth)acrylate, neopentylglycol dimethacrylate, hexanediol di(meth)acrylate, 2-hydroxyethyl methacrylate, 3-methylpentanediol diacrylate, 2-hydroxypropyl acrylate, 1,1,1-trimethylolpropane tri(meth)acrylate, di-, tri- and tetraethylene glycol diacrylate, tripropylene glycol diacrylate and pentaerythritol tetraacrylate. It is also possible to use vinyl esters of aliphatic monocarboxylic acids such as vinyl oleate and vinyl ethers of alcohols such as octadecyl vinyl ether or 1,4-butanediol divinyl ether. A suitable choice of monomers and mixtures thereof makes it possible to modify the properties of the photopolymerizable mixtures of the invention for specific purposes.

Component (b) is in general present in the photosensitive mixture of the invention in amounts of from 1 to 20, preferably from 5 to 12, parts by weight.

Component (c) of the photosensitive mixture of the invention comprises one or more photoinitiators in amounts of from 0.01 to 10, preferably from 0.01 to 5, parts by weight.

Examples of suitable photoinitiators (c) are aromatic keto compounds, such as benzoin, benzoin derivatives, such as its methyl, isopropyl, n-butyl or isobutyl ether, and symmetrically or asymmetrically substituted benzil ketals, such as benzil dimethyl ketal.

Components (d) of the photosensitive mixture of the invention comprises one or more azo dyes of the general formulae (I) to (V)

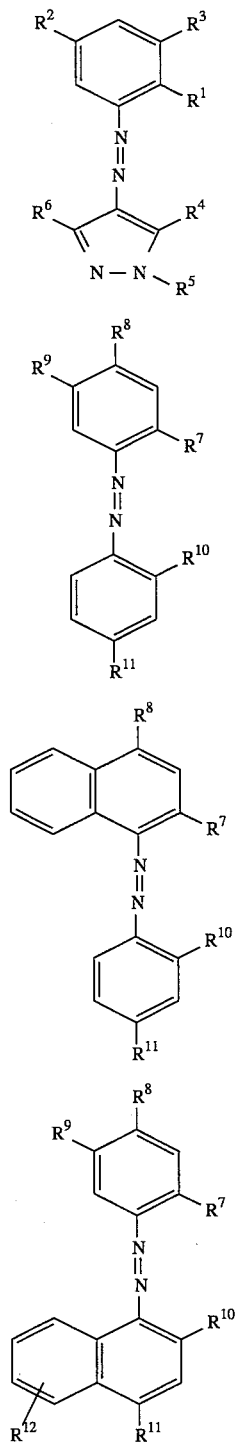

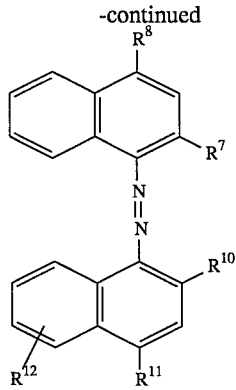

where
R$^1$=H, OH, O$^-$, COOH or COO$^-$,
R$^2$=H or NO$_2$,
R$^3$=H or SO$_3$H,
R$^4$=H, OH or O$^-$,
R$^5$=H or phenyl,
R$^6$=H or CH$_3$,
with the proviso that if R$^1$=O$^-$ or COO$^-$ and R$^4$=O$^-$ two molecules of the azo dyes of the general formula (I) will be combined with one another via a Cr$^{+4}$ central atom to form a Cr$^{+4}$ complex,
R$^7$=H, CH$_3$, COOH, COOR where R=C$_1$- to C$_{12}$-alkyl, preferably C$_1$- to C$_4$-alkyl, e.g. methyl, ethyl, n-propyl, isopropyl, n-butyl, isobutyl, t-butyl, OCH$_3$ or NO$_2$,
R$^8$=H,

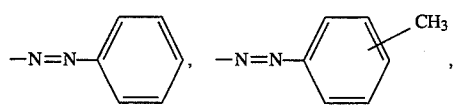

or

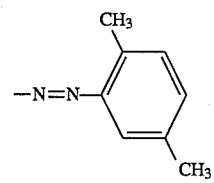

R$^9$=H, CH$_3$, NO$_2$ or SO$_3$H,
R$^{10}$=H, OH, NH$_2$, NHR or NR$_2$ where R=C$_1$- to C$_{12}$-alkyl, preferably C$_1$- to C$_4$-alkyl, e.g. methyl, ethyl, n-propyl, isopropyl, n-butyl, isobutyl or t-butyl,
R$^{11}$=H, H, NH$_2$, NHR or NR$_2$ where R=C$_1$- to C$_{12}$-alkyl, preferably C$_1$- to C$_4$-alkyl, e.g. methyl, ethyl, n-propyl, isopropyl, n-butyl, isobutyl or t-butyl,
R$^{12}$=H, C$_1$- to C$_{12}$-alkyl, preferably C$_1$- to C$_4$-alkyl, e.g. methyl, ethyl, n-propyl, isopropyl, n-butyl, isobutyl or t-butyl, or SO$_3$H.

It is also possible to use mixtures of azo dyes that fall within the general formulae (I) to (V). Component (d) is present in the photosensitive mixture of the invention in amounts of from 0.001 to 0.1, preferably from 0.005 to 0.02, parts by weight.

The photosensitive mixture of the invention may additionally contain further, customary printing plate additives, in minor amounts of up to 20 parts by weight.

To prevent thermal polymerization of the monomers (b), the mixtures of the invention may contain inhibitors such as p-methoxyphenol, hydroquinone, 2,6-di-tert-butyl-4-methylphenol or other commercial inhibitors. For an inhibitor of this type to be selected it must be free of any significant self-absorption in the actinic region of absorption of the photoinitiator used.

To control the hardness of the photosensitive mixtures of the invention they may contain additives generally known from rubber processing, such as plasticizers. For example, the addition of plasticizing paraffin oils in certain amounts results in soft elastic layers having good rebound characteristics. Additions of oligomeric styrene, low molecular weight styrene copolymers, random styrene/butadiene copolymers having a high styrene content and α-methylstyrene copolymers increase the hardness of irradiated layers.

The mixture of the invention is notable for good processing characteristics in the making of layers. The mixtures can be prepared and made into layers of the desired thickness in a conventional manner. For example, layers of the mixtures can be prepared from solutions in suitable solvents (toluene, methyl isobutyl ketone, cyclohexane) by casting onto suitable supports. Similarly, such layers can be produced by pressing, extruding and calendering.

The layer thickness is easy to vary according to the intended use; in the case of photosensitive recording elements such as flexographic printing plates it is varied between 0.01 and 6.5 mm.

Suitable supports for the photosensitive mixtures of the invention are flexible materials such as films of polyethylene terephthalate, polybutylene terephthalate or polycarbonate that have a sufficiently high modulus of elasticity for use as a dimensionally stable support material.

To promote adhesion between layers of the photosensitive mixtures of the invention and the supports it is possible to use commercial one- or two-component adhesives, the type of which depends on the support material and on the photopolymerizable layers to be applied. Frequently suitable adhesives are the commercial two-component adhesives based on polyurethane or polychloroprene which may be applied in suitable thickness to the layers by subbing or casting.

It is frequently of advantage additionally to coat the layer of the mixture according to the invention with a firmly adherent, thin, nontacky layer which preferably is made of polymers forming hard, nontacky, transparent and tear-resistant films, for example a developer soluble polyamide, copolyamide, polyurethane or cyclorubber having a high degree of cyclization. The thickness of this coating layer is advantageously about 0.5–20 μm. This coating makes it possible for example to place the negative on the printing plate without tackiness and without blisters, which in some cases is not possible without a coating on account of the surface tackiness of the layer of photopolymerizable mixture. The coating layer will in general be washed away together with uncrosslinked parts of the photopolymerizable layer in the course of the development of the irradiated parts of the layer to form the relief layer.

It is frequently also advantageous to cover the coating layer with a removable protective cover sheet, such as a polyester sheet, which may also be applied to the photopolymerizable layer together with the coating layer. The protective cover sheet is in general peeled off before the printing plate is subjected to imagewise exposure, while the coating is generally left on the photopolymerizable layer.

Layers of the photosensitive mixtures according to the invention can be processed in a conventional manner by imagewise exposure of the layer and subsequent removal, in particular washing out of the nonirradiated or uncrosslinked parts of the layer with a developer, to relief plates which are particularly suitable for flexographic printing. Suitable exposure units, both of the flat-plate and of the rotary type, are the customary sources for actinic light, such as commercial fluorescent UV tubes or high pressure mercury lamps. The emitted wavelength should preferably be within the range from 300 to 400 nm and/or be adapted to the self-absorption of the photoinitiator present in the photopolymerizable layer. Examples of suitable developers for washing out the uncrosslinked parts of the layer to develop the relief are chlorohydrocarbons, for example tetrachloroethane, hydrocarbons, for example hydrogenated petroleum oil fractions, and other organic solvents, for example methyl isobutyl ketone, or mixtures thereof with lower alcohols for controlling the washout effect.

In the Examples, the parts and percentages are by weight, unless otherwise stated.

Preparation of a mixture of components (a) to (c) using a plasticizer and a thermal polymerization inhibitor (=Mixture A):

A mixture was prepared from 80 parts of a styrene/isoprene/styrene three-block polymer (e.g. Cariflex®TR 1107 [from 15 percent by weight of styrene and 85 percent by weight of isoprene] from Deutsche Shell Chemie GmbH), 10 parts of hexanediol diacrylate, 10 parts of hexanediol dimethacrylate, 10 parts of a white oil containing 60% paraffinic carbon and 40% naphthenic carbon, 0.7 part of 2.6-di-tert-butylcresol and 0.7 part of benzil dimethyl ketal.

COMPARATIVE EXAMPLE 1 (=C1)

Mixture A was used without further additives to prepare a flexographic printing plate 2.84 mm in thickness. To assess the exposure properties, an exposure series was prepared in 3 min steps. The exposure unit used was a nyloflex® FIII flat exposure unit from BASF L+F Aktiengesellschaft; development was carried out on a continuous nyloflex FIII washer from BASF L+F Aktiengesellschaft using nylosolv® (=mixture of 80% by weight of a hydrogenated petroleum oil fraction and 20% by weight of pentanol) as developer. The procedure used was in accordance with the operating instructions for nyloflexe®FA (BASF Aktiengesellschaft, Ludwigshafen, Division Reproduction Technology).

The exposure properties obtained are listed under C1 in Table 2.

COMPARATIVE EXAMPLE 2 (=C2)

Mixture A was homogeneously mixed with 120 ppm of Rhodamine 3 GO (CI Basic Red 4). Then a flexographic printing plate was produced in a layer thickness of 2.84 mm. The rest of the processing and the testing were carried out as described in C1. The exposure properties thus obtained are listed under C2 in Table 2.

COMPARATIVE EXAMPLE 3 ( =C3 )

Mixture A was homogeneously mixed with 120 ppm of Victoria Pure Blue BO (CI Acid Blue 7). The rest of the processing and testing were carried out as described in C2. The exposure properties are listed under C3 in Table 2.

COMPARATIVE EXAMPLE 4 (=C4)

Mixture A was homogeneously mixed with 120 ppm of Anthraquinone Blue 2 GA (CI Basic Blue 7). The rest of the processing and testing were carried out as described in C2. The exposure properties are listed under C4 in Table 2.

OPERATIVE EXAMPLES 1 TO 10 (O1 to O10)

Mixture A was in each case homogeneously mixed with 120 ppm of the azo dyes listed under 1 to 10 in Table 1. The rest of the processing and testing was carried out as described in C2. The exposure properties are indicated under O1 to O10 in Table 2.

TABLE 1

| No. | Formula | $R^1$ | $R^2$ | $R^3$ | $R^4$ | $R^5$ | $R^6$ |
|---|---|---|---|---|---|---|---|
| 1 | (I) $Cr^{+4}$ | $O^-$ | $NO_2$ | H | $O^-$ | phenyl | $CH_3$ |
| 2 | (I) $Cr^{+4}$ | $COO^-$ | H | H | $O^-$ | phenyl | $CH_3$ |
| 3 | (I) $Cr^{+4}$ | $O^-$ | $NO_2$ | $SO_3H$ | $O^-$ | phenyl | $CH_3$ |
| 4 | (I) $Cr^{+4}$ | $COO^-$ | H | H | $O^-$ | phenyl | $CH_3$ |
| 5 | (I) | H | H | H | OH | phenyl | $CH_3$ |
|  |  | $R^{10}$ | $R^{11}$ | $R^{12}$ | $R^7$ | $R^8$ | $R^9$ |
| 6 | (II) | $NH_2$ | $NH_2$ | — | H | H | H |
| 7 | (IV) | OH | H | $CH_3$ | $CH_3$ | 2-$CH_3$-phenyl-azo | H |
| 8 | (IV) | OH | H | — | $CH_3$ | 2-$CH_3$-phenyl-azo | H |
| 9 | (IV) | OH | H | — | $OCH_3$ | H | H |
| 10 | (V) | OH | H | — | H | H | H |

TABLE 2

| Operative/Comparative example | Dye | Conc. ppm | PIT sec | LIT min | UIT min | ITL min |
|---|---|---|---|---|---|---|
| C1 | — | 0 | 15 | 9 | 12 | 3 |
| C2 | Rhodamine 3 GO | 120 | 30 | 12 | 12 | 0 |
| C3 | Victoria Pure Blue 00 | 120 | 40 | 9 | 12 | 3 |
| C4 | Anthraquinone Blue 2 GA | 120 | 25 | 9 | 9 | 0 |
| O1 | No. 1 | 120 | 60 | 9 | 18 | 9 |
| O2 | No. 2 | 120 | 60 | 9 | 18 | 9 |
| O3 | No. 3 | 120 | 30 | 9 | 18 | 9 |
| O4 | No. 4 | 120 | 50 | 9 | 18 | 9 |
| O5 | No. 5 | 120 | 180 | 9 | 18 | 9 |
| O6 | No. 6 | 120 | 200 | 9 | 18 | 9 |
| O7 | No. 7 | 120 | 45 | 9 | 21 | 12 |
| O8 | No. 8 | 120 | 60 | 12 | 30 | 18 |
| O9 | No. 9 | 120 | 60 | 9 | 21 | 12 |
| O10 | No. 10 | 120 | 140 | 9 | 30 | 21 |

PIT = Preirradiation time is the time required to obtain a relief depth of 0.7 mm.
LIT = Lower irradiation time is the time at which a) a screen of 55 µm lines, b) isolated dots having a diameter of 250 µm and c) a 3% tonal value screen are firmly supported at relief depths of up to 0.7 mm.
UIT = Upper irradiation time is the time at which the shadow well depth of a negative dot 400 µm in diameter is at least 70 µm.
ITL = Irradiation time lattitude is the difference between UIT and LIT.

We claim:
1. A photosensitive mixture consisting essentially of
   (a) at least one block copolymer of styrene, butadiene and/or isoprene,
   (b) at least one photopolymerizable olefinically at least monounsaturated organic compound,
   (c) at least one photoinitiator, and
   (d) at least one dye, wherein said dye (d) comprises at least one azo dye of one of the general formulae (III) to (V)

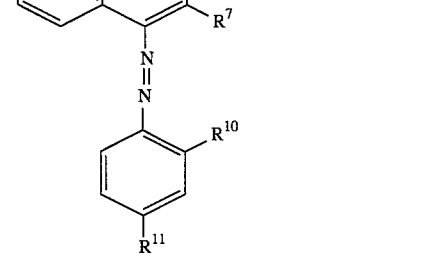

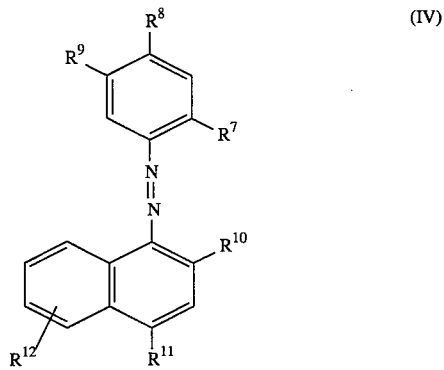

where $R^7$=H, $CH_3$, COOH, COOR where R=$C_1$ to $C_{12}$-alkyl, $OCH_3$ or $NO_2$, $R^8$=$R_8$=H,

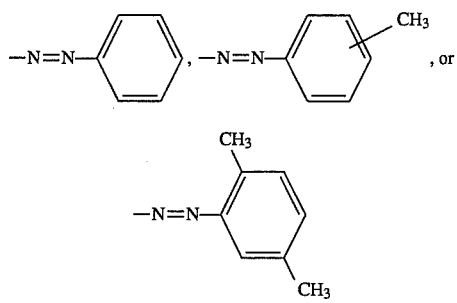

$R^9$=H, $CH_3$, $NO_2$ or $SO_3H$, $R^{10}$=H or OH, $R^{11}$=H, OH, $NH_2$, NHR or $NR_2$ where R=$C_1$- to $C_{12}$-alkyl, $R^{12}$=H, $C_1$- to $C_{12}$-alkyl or $SO_3H$.

2. A photosensitive mixture as defined in claim 1, containing

| | |
|---|---|
| from 60 to 90 | parts by weight of component (a), |
| from 1 to 20 | parts by weight of component (b), |
| from 0.01 to 10 and | parts by weight of component (c) |
| from 0.001 to 0.1 | part by weight of component (d). |

3. A photosensitive mixture as defined in claim 1, containing a plasticizer and/or a thermal polymerization inhibitor.

4. A process for producing relief and printing plates by subjecting a supported photosensitive layer to imagewise exposure under actinic light and developing the relief plate by washing out the nonirradiated parts of the layer, wherein the photosensitive layer consists essentially of the photosensitive mixture of claim 1.

5. A process for producing relief and printing plates by subjecting a supported photosensitive layer to imagewise exposure under actinic light and developing the relief plate by washing out the nonirradiated parts of the layer, wherein the photosensitive layer consists essentially of the photosensitive mixture of claim 2.

6. A process for producing relief and printing plates by subjecting a supported photosensitive layer to imagewise exposure under actinic light and developing the relief plate by washing out the nonirradiated parts of the layer, wherein the photosensitive layer consists essentially of the photosensitive mixture of claim 3.

\* \* \* \* \*

UNITED STATES PATENT AND TRADEMARK OFFICE
CERTIFICATE OF CORRECTION

PATENT NO.: 5,474,875

DATED: December 12, 1995

INVENTOR(S): LOERZER et al.

It is certified that error appears in the above-identified patent and that said Letters Patent is hereby corrected as shown below:

Column 10, claim 1, last line, "$R^8 = R_8 = H$," should read --$R^8 = H$,--.

Signed and Sealed this

Second Day of April, 1996

Attest:

BRUCE LEHMAN

Attesting Officer      Commissioner of Patents and Trademarks